United States Patent [19]

Hjerpe et al.

[11] Patent Number: 5,109,394
[45] Date of Patent: Apr. 28, 1992

[54] ALL DIGITAL PHASE LOCKED LOOP

[75] Inventors: James J. Hjerpe, San Diego; J. Dennis Russell, LaMesa; Rocky M-Y Young, Escondido, all of Calif.

[73] Assignee: NCR Corporation, Dayton, Ohio

[21] Appl. No.: 633,708

[22] Filed: Dec. 24, 1990

[51] Int. Cl.⁵ .............................................. H03D 3/24
[52] U.S. Cl. ..................................... 375/119; 375/120
[58] Field of Search ............................. 375/119, 120;
370/105.3; 331/1 A; 328/155

[56] References Cited

U.S. PATENT DOCUMENTS

| | | | |
|---|---|---|---|
| 3,238,459 | 3/1966 | Landee | 375/119 |
| 3,839,599 | 10/1974 | Pitrode . | |
| 4,151,485 | 4/1979 | LaFratta | 331/1 A |
| 4,374,438 | 2/1983 | Crowley | 455/265 |
| 4,386,323 | 5/1983 | Jansen | 375/119 |
| 4,400,817 | 8/1983 | Sumner | 375/119 |
| 4,538,119 | 8/1985 | Ashida | 331/1 A |
| 4,563,657 | 1/1986 | Qureshi et al. | 331/25 |
| 4,568,888 | 2/1986 | Kimura et al. | 331/10 |
| 4,569,065 | 2/1986 | Cukier | 375/120 |
| 4,617,679 | 10/1986 | Brooks | 375/119 |
| 4,677,648 | 6/1987 | Zurfluh | 375/120 |
| 4,715,050 | 12/1987 | Tanaka et al. | 375/111 |
| 4,743,857 | 5/1988 | Childers | 375/120 |
| 4,780,844 | 10/1988 | Keller | 364/900 |
| 4,789,996 | 12/1988 | Butcher | 375/120 |
| 4,795,985 | 1/1989 | Gailbreath, Jr. | 328/155 |
| 4,808,884 | 2/1989 | Hull et al. | 375/120 |
| 4,821,297 | 4/1989 | Bergmann et al. | 375/120 |
| 4,847,870 | 7/1989 | Butcher | 375/120 |

Primary Examiner—Benedict V. Safourek
Assistant Examiner—Young Tse
Attorney, Agent, or Firm—Gregory P. Gadson

[57] ABSTRACT

An all-digital phase-locked loop (PLL) for synchronizing an output clock signal with a reference clock signal. The PLL has a multiple-tap, digital delay chain in its forward path for delaying the output clock signal, which delay chain is controlled by a digital number stored by a counter in its feedback path. A phase detector in the feedback path provides LEAD and LAG signals, the status of which indicates whether the output clock signal leads or lags the reference signal. In response to the LEAD and LAG signals, a digital sequencer in the feedback path generates the digital number and stores it in the counter. The digital sequencer changes the digital number until the state of the LEAD and LAG signals reverses, and then returns the counter back to its state prior to LEAD and LAG reversal, for synchronism. The digital sequencer also causes a phase reversal of the output signal where the number of delay taps needed for synchronism is large. As a result of the all-digital circuitry, use of unstable prior art voltage-controlled oscillators is obviated.

14 Claims, 3 Drawing Sheets

ALL DIGITAL PHASE LOCKED LOOP

BACKGROUND OF THE INVENTION

The present invention generally relates to computer system clocks, and more particularly to a method and apparatus for generating an output clock signal, which is synchronized with a reference clock signal with the aid of a phase-locked loop (PLL).

Modern digital electronic computers perform a number of routine operations which are controlled by separate clock signals. However, the clock signals must be synchronized (though not necessarily completely matched in all computer systems) at predetermined locations in order for proper functioning of the computer. When simultaneously generated, these separate clock signals do not often arrive at a chosen destination in synchronism, due to variations in circuit propagation delay, and other things which may affect the propagation delay of the individual clock signals. This effect may be more pronounced in systems which use circuits with more than one logic family (such as Emitter-coupled logic (ECL), Transistor-transistor logic (TTL), and Complementary metal-oxide-semiconductor (CMOS), for example).

Thus, there is a need to synchronize (i.e., "de-skew", or match rising edges) output clocks with a reference clock. In order to adjust the output clock signal to match that of the reference clock signal, prior art PLLs typically include a phase detector, a low-pass filter in a forward signal path, and a voltage-controlled oscillator (VCO) in a feedback path. However, precision is often not as high as is desired, since the stability of VCOs is affected by temperature and supply voltage changes.

SUMMARY OF THE INVENTION

It is an object of the present invention to provide a method and apparatus for synchronizing an output clock signal with a reference clock signal which are relatively unaffected by changes in supply voltage.

It is another object of the present invention to provide a method and apparatus for synchronizing an output clock signal with a reference clock signal which are relatively unaffected by changes in temperature.

It is yet another object of the present invention to provide a method and apparatus for synchronizing an output clock signal with a reference clock signal which obviate the need for individual circuit adjustments of a center frequency.

There is provided, in accordance with the present invention, a synchronization method for synchronizing and phase-locking an output clock signal to a reference clock signal in an all-digital PLL, thus eliminating the use of VCOs. In general, the method contains the steps of: delaying the output clock signal in a forward path of the PLL according to a digital number; detecting a phase difference between the output clock signal and the reference clock signal in a feedback path of the PLL; in response to the phase difference, providing the digital number representative of the amount of delay to be applied in the forward path; and changing the digital number until the phase difference reaches a predetermined value.

The details of the present invention will be revealed in the following description with reference to the attached drawings.

DESCRIPTION OF THE PREFERRED EMBODIMENT

Figure 1:
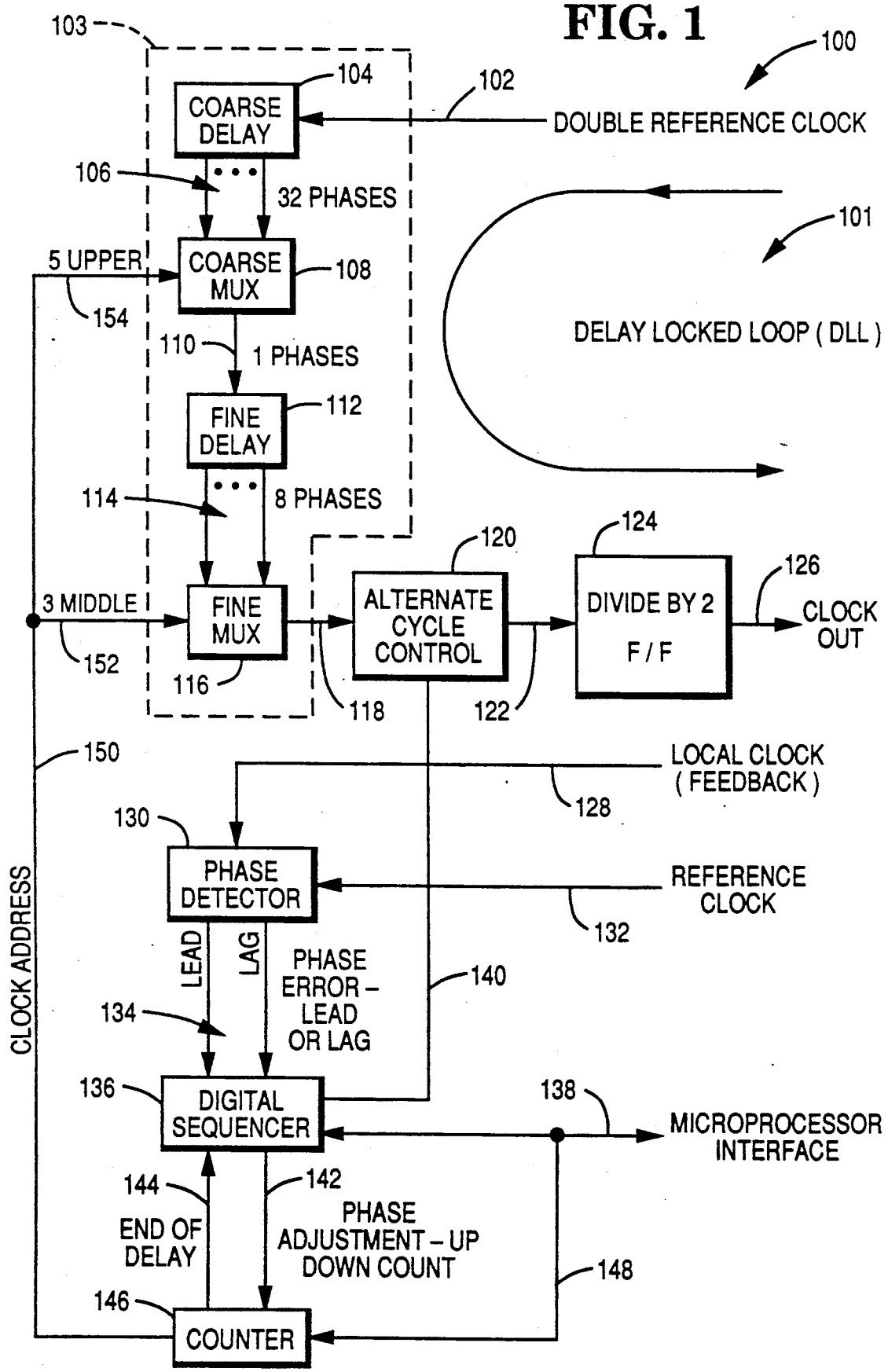
FIG. 1 is a schematic block diagram of the present inventive phase-locked loop.

FIG. 1 shows the present-inventive, all-digital phase-locked loop 100. In addition to the aspirations mentioned in the "Summary of the Invention" section above, the present PLL 100 is distinguishable over the prior art in that: 1) the phase of the output or local signal is generated in discrete increments, rather than as a continuous function; and 2) the phase error is generated as a digital number, rather than as an analog voltage. In the preferred embodiment, an output clock signal can be synchronized to a 40 Megahertz ECL reference clock signal.

A delay-locked loop (DLL) 101 locks in the amount of delay which the PLL determines to be necessary for synchronization (to be explained infra). The DLL 101 consists of a delay chain 103, an alternate cycle control 120, and a simple divide-by-two flip-flop circuit 124. The delay chain 103 has a coarse delay section 104, a coarse delay multiplexer 108, a fine delay section 112, and a fine delay multiplexer 116. The delay chain 103 is shown in greater detail in FIG. 2.

Figure 2:
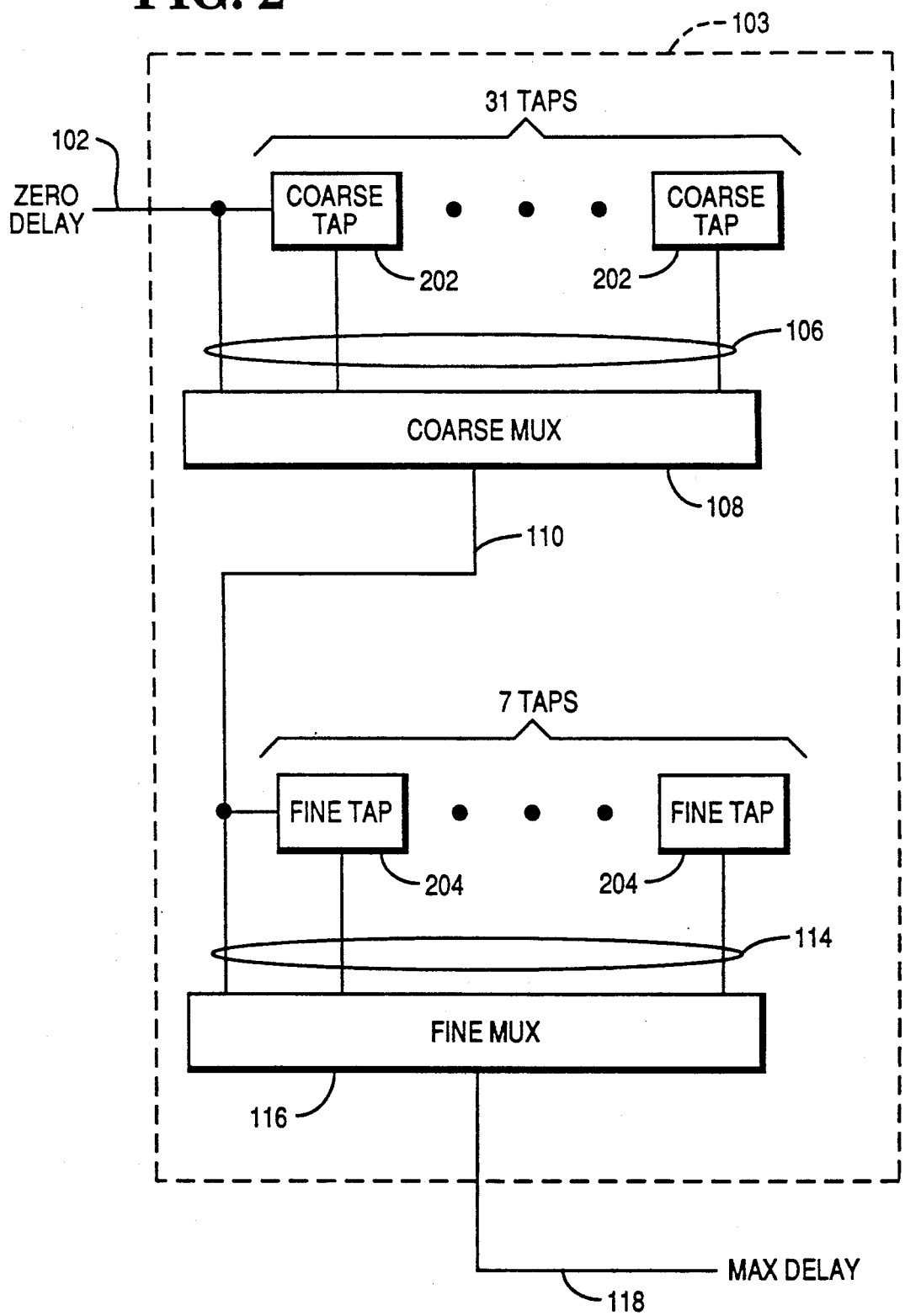
FIG. 2 is a schematic block diagram of the delay chain in the present inventive phase-locked loop.

Referring now to FIGS. 1 and 2, during operation of the PLL 100, an input signal which is double the frequency of the reference clock is introduced to the delay chain 103 via an input line 102. The input signal is delayed in the coarse delay section 104 by as many as 31 coarse delay taps 202 (see FIG. 2). Each coarse delay tap 202 can delay the signal approximately 0.77 nanoseconds.

The output lines 106 of the coarse delay section 104, which includes a line for an undelayed input signal, are fed to the coarse delay multiplexer 108. Under the control of a control signal introduced on a line 154 (FIG. 1), the coarse delay multiplexer 108 selects a line representing the appropriate amount of coarse delay, and outputs a signal over a line 110 to the fine delay section 112.

The fine delay section 112 has 7 fine delay taps 204 (see FIG. 2) which can delay the signal in 0.11 nanosecond increments. The output lines 114 of the fine delay section 112 (including one line without delay) are available for selection by the fine delay multiplexer 116. The fine delay multiplexer 116 is controlled by a control signal introduced over a line 152 (FIG. 1). The delayed signal is output over line 118, and may have its phase reversed, when appropriate, by the alternate cycle control 120.

Recall that the input clock signal at line 102 is at 80 megahertz, but the reference clock signal is at 40 megahertz. The divide-by-two flip-flop 124 frequency-divides the signal received over the line 122 back to 40 megahertz.

The line 128 is a feedback path which introduces the output clock signal appearing over line 126 to the input of a phase detector 130. The phase detector 130 determines the relative phase between the reference clock signal introduced via line 132 and the output clock signal introduced via line 128. As conventional, the phase detector 130 has two set/reset flip-flops (not shown) which output a LEAD signal and a LAG signal over phase detector output lines 134. The state of the LEAD and LAG signals indicates whether the reference signal leads the output signal, lags the output signal, or whether both signals have reached a "crossover" point, signifying near synchronism. When a crossover point is reached, both LEAD and LAG signals reverse their levels.

The LEAD and LAG signals are received by a microprocessor-controlled (via line 138) digital sequencer 136, which adjusts the amount of delay in the delay chain 103 until synchronism is reached.

Figure 3:
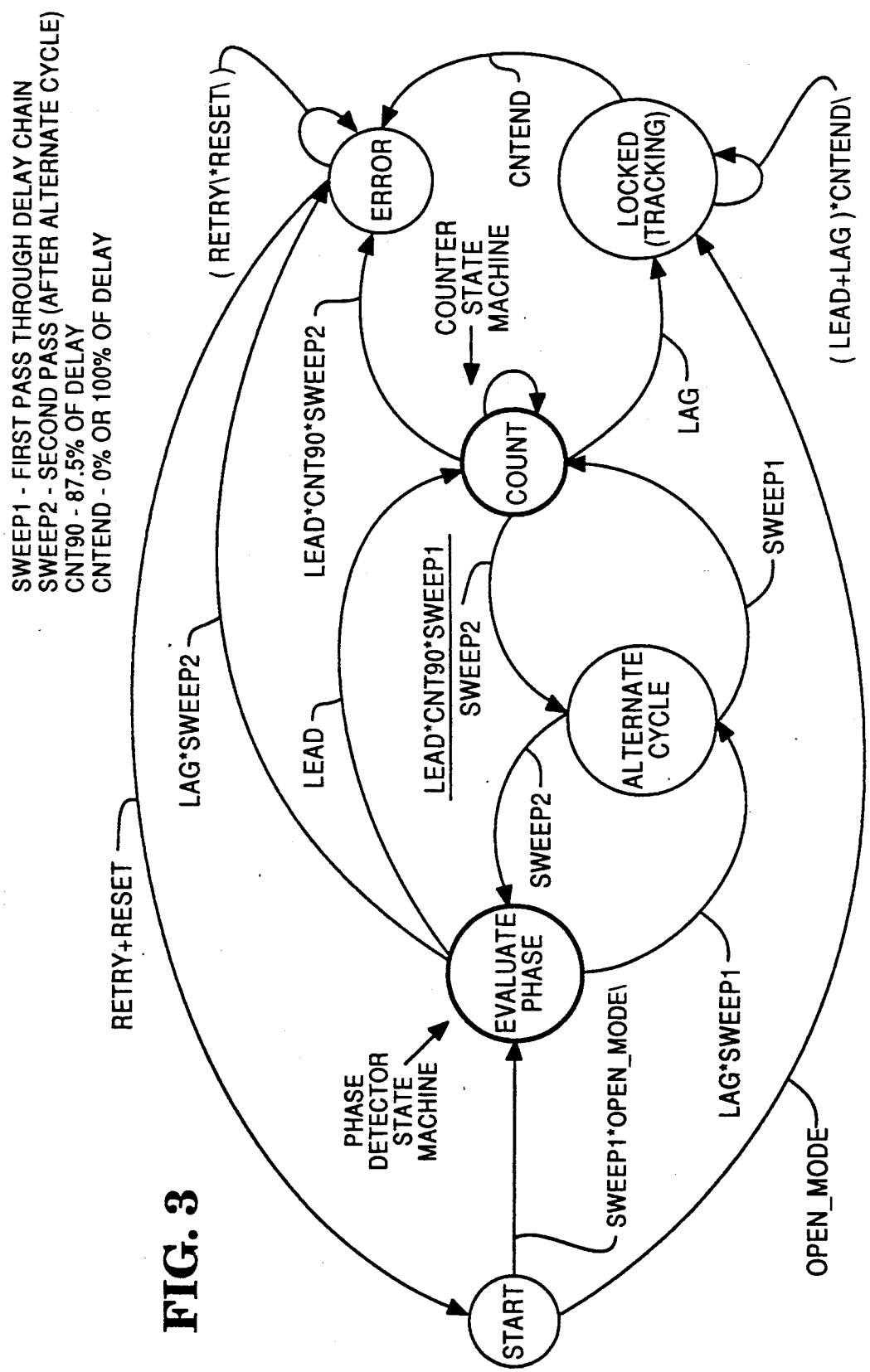
FIG. 3 is a state machine diagram for the digital sequencer in the present inventive phase-locked loop.

The operation of the digital sequencer 136 will now be described with reference to the state diagram in FIG. 3. The digital sequencer 136 first ensures that the reference signal lags the output signal. If the reference signal leads the output signal, the digital sequencer 136 instructs (via line 140) the alternate cycle control section 120 to perform a phase reversal upon the output signal. The alternate cycle section 120 accomplishes the reversal by deleting a pulse from the signal it has received.

The digital sequencer 136 then begins adjustment of the delay chain 103 until synchronism is reached. The digital sequencer 136 sends a 10-bit digital word (a "count") over a multi-wire line 142 to a counter 146 after every phase adjustment iteration. Representing the amount of delay, the 10-bit word has 5 upper bits to indicate which of the 31 coarse delay taps are to be used, 3 middle bits to indicate which of the 7 fine delay taps are to be used, and 2 lower bits which are used by the digital sequencer 136 (via line 144) to average the change in count during tracking. The contents of the counter are output by the counter output line 150. The coarse delay (5 upper) bits form the control signal for the coarse delay multiplexer 108, and are delivered via line 154, while the fine delay (3 middle) bits form the control signal for the fine delay multiplexer 112, and are delivered via line 152.

After it is ensured that the reference signal lags the output signal, the digital sequencer increments the count in the counter 146 so that a new coarse delay tap is chosen by the coarse delay multiplexer. All changes in the count are followed by changes in the delay of the output signal. The digital sequencer 136 then checks the LEAD and LAG signals to see if a crossover of the LEAD and LAG signals has occurred. If not, the count is incremented to connect another coarse delay tap. After every increment in the count, the LEAD and LAG signals are checked. When it is observed that the LEAD and LAG signals switch their state, the digital sequencer ceases to update the coarse delay portion of the count. The counter is then returned to the count previous to the one which caused crossover.

The same procedure is carried out for fine tuning. That is, the fine delay bits are continually incremented until crossover again occurs. And then the fine delay bits are returned to their pre-crossover state. At this point the output and reference signals are synchronized, and further adjustments during tracking will involve fine delay, only. The changes in phase during tracking may be caused by temperature shift, for example.

Because it is desirable to have a margin available during tracking at both ends of the delay taps, the digital sequencer 136 stops short of activating all of the delay taps during a phase synchronization operation. (During tracking it may be necessary to introduce further delay, which would be impossible if all of the stages have been exhausted.) Therefore, the digital sequencer 136 causes successive delay taps to be connected until a predefined number in the chain is reached. The predefined number is a matter of design choice, and connection of the predefined number of taps in the process is indicated via line 144. If crossover has not yet occurred, the digital sequencer instructs the alternate cycle control section 120 to perform a phase reversal. The delay iterations are restarted until alignment is achieved as described above. The phase reversal allows all of the delay taps to be available for synchronization, while maintaining ample room for adjustment during tracking.

After synchronization has occurred, the predefined number of delay taps is then ignored by the digital sequencer, and all of the delay taps are available for phase correction of the output signal during tracking.

Variations and modifications to the present invention are possible given the above disclosure. However, all such variations and modifications are intended to be within the scope of the invention claimed by this letters patent.

We claim:

1. A synchronization method for synchronizing and phase-locking an output clock signal to a reference clock signal in a phase-locked loop (PLL) comprising the steps of:

delaying said output clock signal in a forward path of said PLL according to a digital number;

feeding back said output clock signal to a feedback path of said PLL;

in said feedback path, detecting a phase difference between said output clock signal and said reference clock signal, and generating LEAD and LAG signals determinative of whether the output clock signal leads or lags the reference clock signal, respectively;

in response to said phase difference, providing said digital number representative of the amount of delay to be applied in said forward path; and changing said digital number in delay increments until the phase difference reaches a predetermined value;

wherein said changing step is performed until the states of said LEAD and LAG signals reverse, and then replacing said digital number with its value just prior to the value which caused the reversal of said LEAD and LAG signals.

2. The synchronization method in claim 1 further comprising the step of:

as a first step, inverting said output clock signal when said output clock signal lags said reference clock signal, so said output clock signal then leads said reference clock signal.

3. The synchronization method in claim 2 wherein when a predefined number of increments has been reached before the states of said LEAD and LAG signals reverse, said output clock signal is inverted, and said changing step is restarted.

4. The synchronization method in claim 1 wherein when a predefined number of increments has been reached before the states of said LEAD and LAG signals reverse, said output clock signal is inverted, and said changing step is restarted.

5. A synchronization method for synchronizing and phase-locking an output clock signal to a reference clock signal in a phase-locked loop (PLL) comprising the steps of:

delaying said output clock signal in a forward path of said PLL according to a digital number;

feeding back said output clock signal to a feedback path of said PLL;

in said feedback path, detecting a phase difference between said output clock signal and said reference clock signal, and generating LEAD and LAG signals determinative of whether the output clock signal leads or lags the reference clock signal, respectively;

in response to said phase difference, providing said digital number representative of the amount of delay to be applied in said forward path;

changing said digital number in delay increments until the phase difference reaches a predetermined value; and as a first step, inverting said output clock signal when said output clock signal lags said reference clock signal, so said output clock signal then leads said reference clock signal.

6. The synchronization method in claim 5 wherein when a predefined number of increments has been reached before the states of said LEAD and LAG signals reverse, said output clock signal is inverted, and said changing step is restarted.

7. A synchronization method for synchronizing and phase-locking an output clock signal to a reference clock signal in a phase-locked loop (PLL) comprising the steps of:

delaying said output clock signal in a forward path of said PLL according to a digital number;

feeding back said output clock signal to a feedback path of said PLL;

in said feedback path, detecting a phase difference between said output clock signal and said reference clock signal;

in response to said phase difference, providing said digital number representative of the amount of delay to be applied in said forward path; and changing said digital number in delay increments until the phase difference reaches a predetermined value;

wherein said delaying step involves both coarse and fine delay.

8. A phase-locked loop (PLL) for synchronizing and phase-locking an output clock signal to a reference clock signal comprising:

a delay chain in a forward path of said PLL for delaying said output clock signal according to a digital number;

feedback means for feeding back said output clock signal to a feedback path of said PLL;

a phase detector in said feedback path for detecting a phase difference between said output clock signal and said reference clock signal, said phase detector comprising means for generating LEAD and LAG signals determinative of whether the output clock signal leads or lags the reference clock signal, respectively; and a digital sequencer coupled to said phase detector for providing, in response to said phase difference, said digital number representative of the amount of delay to be applied in said forward path, and for changing said digital number in delay increments until the phase difference reaches a predetermined value;

wherein said digital sequencer changes said digital number until the states of said LEAD and LAG signals revere, and then replaces said digital number with its value just prior to the value which caused the reversal of said LEAD and LAG signals.

9. The PLL in claim 8 further comprising:

inverting means coupled to an output of said delay chain for inverting said output clock signal when said output clock signal lags said reference clock signal, so said output clock signal then leads said reference clock signal.

10. The PLL in claim 9 wherein when the number of delay increments made by said digital sequencer reaches a predefined number before the states of said LEAD and LAG signals reverse, said output clock signal is inverted, and said digital sequencer restarts changing said digital number.

11. The PLL in claim 8 wherein when the number of delay increments made by said digital sequencer reaches a predefined number before the states of said LEAD and LAG signals revere, said output clock signal is inverted, and said digital sequencer restarts changing said digital number.

12. A phase-locked loop (PLL) for synchronizing and phase-locking an output clock signal to a reference clock signal comprising:

a delay chain in a forward path of said PLL for delaying said output clock signal according to a digital number;

feedback means for feeding back said output clock signal to a feedback path of said PLL;

a phase detector in said feedback path for detecting a phase difference between said output clock signal and said reference clock signal, said phase detector comprising means for generating LEAD and LAG signals determinative of whether the output clock signal leads or lags the reference clock signal, respectively;

a digital sequencer coupled to said phase detector for providing, in response to said phase difference, said digital number representative of the amount of delay to be applied in said forward path, and for changing said digital number in delay increments until the phase difference reaches a predetermined value; and inverting means coupled to an output of said delay chain for inverting said output clock signal when said output clock signal lags said reference clock signal, so said output clock signal then leads said reference clock signal.

13. The PLL in claim 12 wherein when the number of delay increments made by said digital sequencer reaches a predefined number before the states of said LEAD and LAG signals reverse, said output clock signal is inverted, and said digital sequencer restarts changing said digital number.

14. A phase-locked loop (PLL) for synchronizing and phase-locking an output clock signal to a reference clock signal comprising:

a delay chain in a forward path of said PLL for delaying said output clock signal according to a digital number;

feedback means for feeding back said output clock signal to a feedback path of said PLL;

a phase detector in said feedback path for detecting a phase difference between said output clock signal and said reference clock signal; and a digital sequencer coupled to said phase detector for providing, in response to said phase difference, said digital number representative of the amount of delay to be applied in said forward path, and for changing said digital number in delay increments until the phase difference reaches a predetermined value;

wherein said delay chain has both coarse and fine delay.

* * * * *